US012635270B2

(12) United States Patent
Akeno et al.

(10) Patent No.: US 12,635,270 B2
(45) Date of Patent: May 19, 2026

(54) MANUFACTURING METHOD OF FILTER FOR SOLID-STATE IMAGING ELEMENT AND MANUFACTURING METHOD OF SOLID-STATE IMAGING ELEMENT

(71) Applicant: TOPPAN Inc., Tokyo (JP)

(72) Inventors: Yasutake Akeno, Taito-ku (JP); Reiko Iwata, Taito-ku (JP); Yuri Nagai, Taito-ku (JP)

(73) Assignee: TOPPAN Inc., Tokyo (JP)

( * ) Notice: Subject to any disclaimer, the term of this patent is extended or adjusted under 35 U.S.C. 154(b) by 1012 days.

(21) Appl. No.: 17/752,994

(22) Filed: May 25, 2022

(65) Prior Publication Data

US 2022/0293664 A1     Sep. 15, 2022

Related U.S. Application Data

(63) Continuation of application No. PCT/JP2020/044296, filed on Nov. 27, 2020.

(30) Foreign Application Priority Data

Nov. 27, 2019     (JP) ................................. 2019-214304

(51) Int. Cl.
*H10F 39/00*     (2025.01)

(52) U.S. Cl.
CPC ....... *H10F 39/024* (2025.01); *H10F 39/8053* (2025.01); *H10F 39/8063* (2025.01)

(58) Field of Classification Search
CPC ............... H10F 39/024; H10F 39/8053; H10F 39/8063; G02B 5/208
See application file for complete search history.

(56) References Cited

U.S. PATENT DOCUMENTS 10,854,661 B2 *  12/2020  Hatakeyama .......... H04N 23/11
10,903,278 B2    1/2021   Kataoka et al.
(Continued)

FOREIGN PATENT DOCUMENTS

JP     2003-060176 A     2/2003
JP     2007-219114 A     8/2007
(Continued)

OTHER PUBLICATIONS

International Search Report issued Jan. 12, 2021 in PCT/JP2020/044296, filed Nov. 27, 2020, 5 pages, (with English Translation).
(Continued)

*Primary Examiner* — Mounir S Amer
*Assistant Examiner* — Alexander Belousov
(74) *Attorney, Agent, or Firm* — Oblon, McClelland, Maier & Neustadt, L.L.P.

(57) ABSTRACT

A method of manufacturing a filter for a solid-state imaging element, including forming a color filter on a semiconductor substrate, forming an etching stopper layer on the semiconductor substrate and the color filter, forming an infrared cut precursor layer on the etching stopper layer, forming a resist pattern that covers a portion on the color filter in the infrared cut precursor layer, and forming an infrared cut filter by dry etching the infrared cut precursor layer using the resist pattern. The dry etching of the infrared cut precursor layer is conducted at an etching rate different from an etching rate of the etching stopper layer.

18 Claims, 9 Drawing Sheets

(56)        References Cited

U.S. PATENT DOCUMENTS

2017/0317131 A1*  11/2017  Shimada ................. G02B 5/223
2017/0317132 A1*  11/2017  Hatakeyama ......... H10F 39/184
2018/0301491 A1*  10/2018  Nakamoto ............ H10F 39/807
2019/0206917 A1*   7/2019  Nakajiki ............. H10F 39/8053
2019/0259815 A1     8/2019  Kataoka et al.
2019/0378868 A1*  12/2019  Takahashi ............... H10F 39/18
2020/0258929 A1*   8/2020  Imoto ...................... G02B 5/20
2021/0118928 A1*   4/2021  Sayama ............. H10F 39/8053
2021/0118931 A1*   4/2021  Matsunuma ........ H10F 39/8057
2021/0143219 A1     5/2021  Kataoka et al.
2022/0293664 A1*   9/2022  Akeno ................. H10F 39/024

FOREIGN PATENT DOCUMENTS

| JP | 2018-060910 A | 4/2018 |
| JP | 2019-180048 A | 10/2019 |
| WO | WO 2018/043654 A1 | 3/2018 |
| WO | WO 2018/211813 A1 | 11/2018 |
| WO | WO 2019/087661 A1 | 5/2019 |

OTHER PUBLICATIONS

Extended European Search Report issued Dec. 5, 2022 in European Patent Application No. 20893512.2, 6 pages.

* cited by examiner 16R    16S 16G    16S    16P

16B

15

10F 14H
14

13H
13

11 (11R)

12R

12P

12G 11 (11P)

11 (11G)

TP

12B 11 (11B)

FIG.3
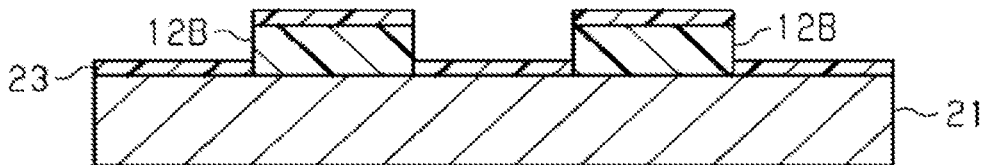
FIG.4
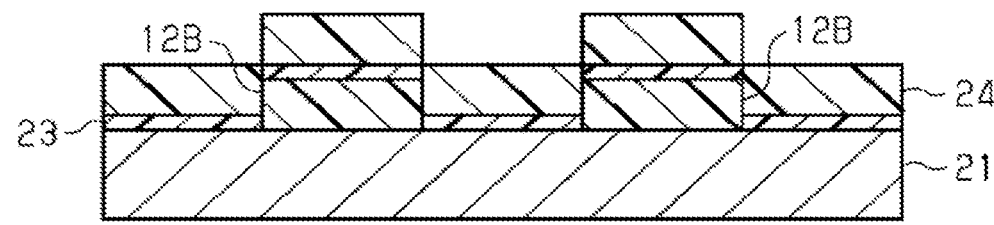
FIG.5

FIG.24
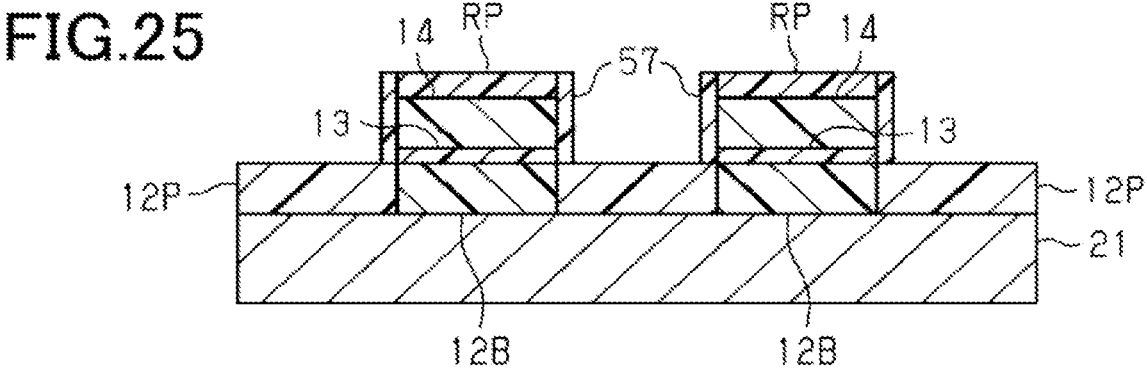
FIG.25
FIG.26
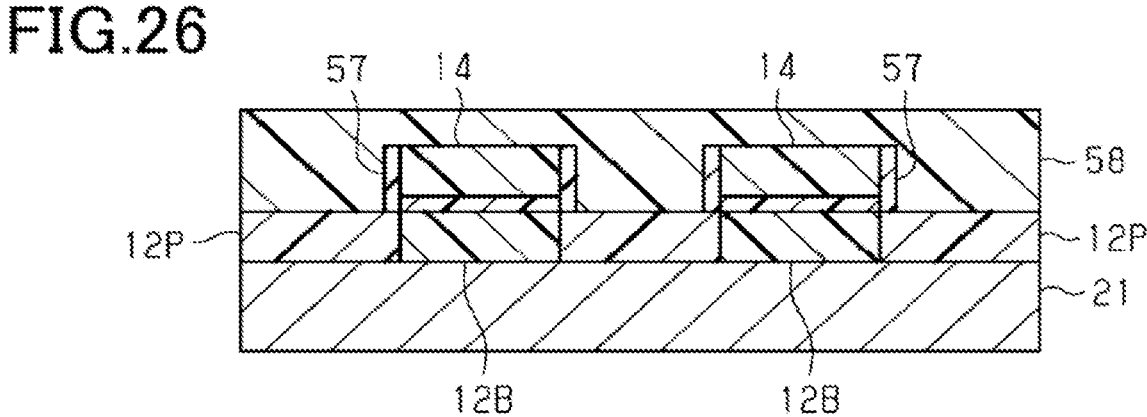

MANUFACTURING METHOD OF FILTER FOR SOLID-STATE IMAGING ELEMENT AND MANUFACTURING METHOD OF SOLID-STATE IMAGING ELEMENT

CROSS-REFERENCE TO RELATED APPLICATIONS

The present application is a continuation of International Application No. PCT/JP2020/044296, filed Nov. 27, 2020, which is based upon and claims the benefits of priority to Japanese Application No. 2019-214304, filed Nov. 27, 2019. The entire contents of all of the above applications are incorporated herein by reference.

BACKGROUND OF THE INVENTION

Field of the Invention

The present invention relates to a manufacturing method of a filter for a solid-state imaging element, and a manufacturing method of the solid-state imaging element.

Discussion of the Background

A solid-state imaging element such as a CMOS image sensor and a CCD image sensor includes a photoelectric conversion element that converts the intensity of light into an electrical signal. As an example, the solid-state imaging element can detect light respectively corresponding to different colors. The solid-state imaging element includes color filters for respective colors and photoelectric conversion elements corresponding to the respective color filters and detects light of colors different from each other using the respective photoelectric conversion elements (see, for example, JP 2003-060176 A). As another example, the solid-state imaging element includes an organic photoelectric conversion element and an inorganic photoelectric conversion element and detects light of colors different from each other using the respective photoelectric conversion elements without using color filters (see, for example, JP 2018-060910 A).

The solid-state imaging element includes an infrared cut filter on the photoelectric conversion elements. Infrared light that can be detected by each photoelectric conversion element is cut-off from reaching the photoelectric conversion element by an infrared absorbing pigment included in the infrared cut filter absorbing infrared light. This can improve detection accuracy of visible light at each photoelectric conversion element. The infrared cut filter includes, for example, a cyanine pigment that is an infrared light absorbing pigment (see, for example, JP 2007-219114 A).

SUMMARY OF THE INVENTION

According to an aspect of the present invention, a method of manufacturing a filter for a solid-state imaging element, includes forming a color filter on a semiconductor substrate, forming an etching stopper layer on the semiconductor substrate and the color filter, forming an infrared cut precursor layer on the etching stopper layer, forming a resist pattern that covers a portion on the color filter in the infrared cut precursor layer, and forming an infrared cut filter by dry etching the infrared cut precursor layer using the resist pattern. The dry etching of the infrared cut precursor layer is conducted at an etching rate different from an etching rate of the etching stopper layer.

According to another aspect of the present invention, a method of manufacturing a solid-state imaging element, includes preparing a semiconductor substrate, forming a color filter on the semiconductor substrate, forming an etching stopper layer on the semiconductor substrate and the color filter, forming an infrared cut precursor layer on the etching stopper layer, forming a resist pattern that covers a portion on the color filter in the infrared cut precursor layer, and forming an infrared cut filter by dry etching the infrared cut precursor layer using the resist pattern. The dry etching of the infrared cut precursor layer is conducted at an etching rate different from an etching rate of the etching stopper layer.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein:

FIG. 3 explains the manufacturing method of the solid-state imaging element in the first embodiment.

FIG. 4 explains the manufacturing method of the solid-state imaging element in the first embodiment.

FIG. 5 explains the manufacturing method of the solid-state imaging element in the first embodiment.

FIG. 24 explains the manufacturing method of the solid-state imaging element in the fourth embodiment.

FIG. 25 explains the manufacturing method of the solid-state imaging element in the fourth embodiment.

FIG. 26 explains the manufacturing method of the solid-state imaging element in the fourth embodiment.

DESCRIPTION OF THE EMBODIMENTS

Figures 1, 2:
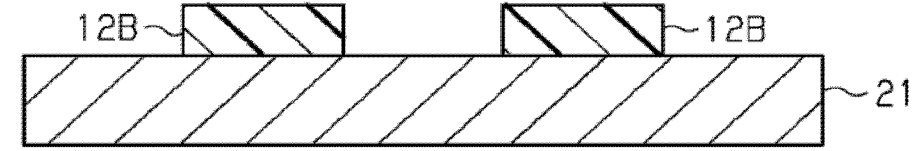
FIG. 1 is an exploded perspective view illustrating a structure of a solid-state imaging element of a first embodiment.
FIG. 2 explains a manufacturing method of the solid-state imaging element in the first embodiment.

The embodiments will now be described with reference to the accompanying drawings, wherein like reference numerals designate corresponding or identical elements throughout the various drawings.

First Embodiment

A first embodiment of a manufacturing method of a filter for a solid-state imaging element and a manufacturing method of the solid-state imaging element will be described with reference to FIG. 1 to FIG. 12. The solid-state imaging element and the manufacturing method of the solid-state imaging element will be sequentially described below. Note that in the present embodiment, infrared light is light having a wavelength in a range between 0.7 μm and 1 mm, and near-infrared light is light having a wavelength particularly in a range between 700 nm and 1100 nm, of infrared light.
<Solid-State Imaging Element>

The solid-state imaging element will be described with reference to FIG. 1. FIG. 1 is a schematic configuration diagram illustrating respective layers in part of the solid-state imaging element in a divided manner.

As illustrated in FIG. 1, a solid-state imaging element 10 includes a filter for a solid-state imaging element 10F and a plurality of photoelectric conversion elements 11. The plurality of photoelectric conversion elements 11 include a red photoelectric conversion element 11R, a green photoelectric conversion element 11G, a blue photoelectric conversion element 11B, and a photoelectric conversion element for infrared light 11P.

The solid-state imaging element 10 includes a plurality of red photoelectric conversion elements 11R, a plurality of green photoelectric conversion elements for green 11G, a plurality of blue photoelectric conversion elements 11B, and a plurality of photoelectric conversion elements for infrared light 11P. The plurality of photoelectric conversion elements for infrared light 11P measure intensity of infrared light. Note that FIG. 1 illustrates a repeating unit of the photoelectric conversion elements 11 in the solid-state imaging element 10 for convenience of illustration.

The filter for the solid-state imaging element 10F includes a plurality of filters for visible light, an infrared pass filter 12P, an etching stopper layer 13, an infrared cut filter 14, an oxygen barrier layer 15, a plurality of microlenses for visible light, and a microlens 16 P for infrared light.

The color filter for visible light includes a red filter 12R, a green filter 12G, and a blue filter 12B. The red filter 12R is positioned on a light incident side with respect to the red photoelectric conversion element 11R. The green filter 12G is positioned on a light incident side with respect to the green photoelectric conversion element 11G. The blue filter 12B is positioned on a light incident side with respect to the blue photoelectric conversion element 11B.

The infrared pass filter 12P is positioned on a light incident side with respect to the photoelectric conversion element for infrared light 11P. The infrared pass filter 12P cuts visible light that can be detected by the photoelectric conversion element for infrared light 11P with respect to the photoelectric conversion element for infrared light 11P. In other words, visible light incident on the infrared pass filter 12P is prevented from passing through the infrared pass filter 12P. This can improve detection accuracy of infrared light 12P by the photoelectric conversion element for infrared light 11P. Infrared light that can be detected by the photoelectric conversion element for infrared light 11P is, for example, near-infrared light.

The etching stopper layer 13 is positioned on a light incident side with respect to the filters for respective colors 12R, 12G and 12B. The etching stopper layer 13 includes a through-hole 13H. When viewed from a viewpoint facing a plane on which the etching stopper layer 13 extends, the infrared pass filter 12P is positioned in a region sectioned by the through-hole 13H. Meanwhile, when viewed from the viewpoint facing the plane on which the etching stopper layer 13 extends, the etching stopper layer 13 is positioned on the red filter 12R, the green filter 12G, and the blue filter 12B.

The infrared cut filter 14 is positioned on a light incident side with respect to the etching stopper layer 13. The infrared cut filter 14 includes a through-hole 14H. When viewed from a viewpoint facing a plane on which the infrared cut filter 14 extends, the infrared pass filter 12P is positioned in a region sectioned by the through-hole 14H. Meanwhile, when viewed from the viewpoint facing the plane on which the infrared cut filter 14 extends, the infrared cut filter 14 is positioned on the red filter 12R the green filter 12G, the blue filter 12B, and the etching stopper layer 13.

The oxygen barrier layer 15 is positioned on a light incident side with respect to the infrared cut filter 14. The oxygen barrier layer 15 is a layer common to the red filter 12R, the green filter 12G, and the blue filter 12B. The oxygen barrier layer 15 prevents oxygen sources from passing through the infrared cut filter 14. The oxygen sources are, for example, oxygen, water, and the like.

An oxygen transmittance of the oxygen barrier layer 15 is preferably, for example, equal to or less than 5.0 $cc/m^2/day/atm$. The oxygen transmittance is a value according to JIS K7126:2006. The oxygen transmittance is determined to be equal to or less than 5.0 $cc/m^2/day/atm$, and thus, the oxygen barrier layer 15 prevents the oxygen sources from reaching the infrared cut filter 14. Thus, the infrared cut filter 14 is less likely to be oxidized by the oxygen sources. This enables improvement in light resistance of the infrared cut filter 14.

The microlens is constituted with a red microlens 16R, a green microlens 16B, a blue microlens 16B, and a microlens for infrared light 16P. The red microlens 16R is positioned on a light incident side with respect to the red filter 12R. The green microlens 16G is positioned on a light incident side with respect to the green filter 12G. The blue microlens 16B is positioned on a light incident side with respect to the blue filter 12B. The microlens for infrared light 16P is positioned on a light incident side with respect to the infrared pass filter 12P.

Each of the microlenses 16R, 16G, 16B, and 16P includes an incidence plane 16S that is an outer surface. Each of the microlenses 16R, 16G, 16B and 16P has a difference in refractive index from external air, that is, a gas surrounding each of the microlenses 16R, 16G, 16B, and 16P, for collecting light incident on the incidence plane 16S toward each of the photoelectric conversion elements 11R 11G, 11B, and 11P. Each of the microlenses 16R, 16G, 16B, and 16P includes a transparent resin.

The filters for respective colors 12R, 12G and 12B are thinner than the infrared pass filter 12P. A sum of a thickness of the etching stopper layer 13 and a thickness of the infrared cut filter 14 corresponds to a difference between thicknesses of the filter for respective colors 12R, 12G, and 12B and a thickness of the infrared pass filter 12P. The infrared pass filter 12P is thicker than the filters for respective colors 12R, 12G, and 12B. Meanwhile, a difference in level TP between the infrared pass filter 12P and the filters for respective colors 12R, 12G, and 12B is filled by the etching stopper layer 13 and the infrared cut filter 14. This makes it easy to obtain flatness in the lower layer of the microlenses for respective colors 16R, 16G, and 16B and the microlens for infrared light 16P.

<Manufacturing Method of Solid-State Imaging Element>

The manufacturing method of the solid-state imaging element including the filter for the solid-state imaging element will be described with reference to FIG. 2 to FIG. 10. The manufacturing method of the filter for the solid-state imaging element includes forming a color filter, forming an etching stopper layer, forming an infrared cut precursor layer, forming a resist pattern, and forming an infrared cut filter. In formation of the color filter, the color filter is formed on a semiconductor substrate. In formation of the etching stopper layer, the etching stopper layer is formed on the semiconductor substrate including the color filter. In formation of the infrared cut precursor layer, the infrared cut precursor layer having an etching rate in dry etching different from an etching layer of the etching stopper layer is formed on the etching stopper layer. In formation of the resist pattern, the resist pattern is formed so as to cover a portion positioned on the color filter in the infrared cut precursor layer. In formation of the infrared cut filter, the infrared cut precursor layer is dry etched using the resist pattern.

The manufacturing method of the filter for the solid-state imaging element and the manufacturing method of the solid-state imaging element will be described in detail below with reference to the drawings. FIG. 2 to FIG. 10 schematically illustrate a cross-section in a case where the solid-state imaging element is cut in a direction in which layers constituting the solid-state imaging element are laminated.

As illustrated in FIG. 2, in the manufacturing method of the filter for the solid-state imaging element, first, a semiconductor substrate 21 is prepared. In the semiconductor substrate 21, a plurality of photoelectric conversion elements are arranged in two dimensions so that one pixel corresponds to one photoelectric conversion element. Note that in FIG. 2 to FIG. 10, illustration of two photoelectric conversion elements for blue light and three photoelectric conversion elements for infrared light is omitted. In FIG. 2 to FIG. 10, the photoelectric conversion element for blue light and the photoelectric conversion element for infrared light are alternately arranged in one direction. Materials of the semiconductor substrate 21 may be, for example, Si, an oxide such as $SiO_2$, a nitride such as SiN, or a mixture thereof.

Then, the blue filter 12B corresponding to the blue photoelectric conversion element provided on the semiconductor substrate 21 is formed on the semiconductor substrate 21. The blue filter 12B is formed by forming a coating film containing a first photosensitive resin for forming the blue filter 12B and patterning the coating film through photolithography. For example, the coating film containing the first photosensitive resin is formed by applying a liquid containing the first photosensitive resin and drying the coating film. The blue filter 12B is formed through exposure and development of a region of the blue filter 12B in the coating film containing the first photosensitive resin. Note that the green filter 12G and the red filter 12R are formed on the semiconductor substrate 21 using a method similar to the method for the blue filter 12B.

As illustrated in FIG. 3, the etching stopper layer 23 is formed on the semiconductor substrate 21 including the blue filter 12B. When the etching stopper layer 23 is formed, first, an application liquid is formed using a resin containing silicon. The resin containing silicon may be, for example, polysiloxane, or the like. Polysiloxane is formed from a repeating structure of a siloxane bond. The polysiloxane may be silicone. Silicone is a polysiloxane and may include an organic group such as an alkyl group or an aryl group.

Then, the application liquid is applied on the blue filter 12B and a portion where a surface of the semiconductor substrate 21 is exposed in the semiconductor substrate 21, and the coating film is dried. Then, the dried coating film is cured by heating. By this means, the etching stopper layer 23 is formed on the filters for respective colors and a portion where the filters for respective colors are not positioned on the surface of the semiconductor substrate 21.

As illustrated in FIG. 4, the infrared cut precursor layer 24 is formed on the etching stopper layer 23. When the infrared cut precursor layer 24 is formed, first, a liquid containing an infrared absorbing pigment, a transparent resin and an organic solvent is applied on the etching stopper layer 23, and the coating film is dried. Then, the dried coating film is cured by heating. By this means, the infrared cut precursor layer 24 is formed on the etching stopper layer 23.

The infrared absorbing pigment for forming the infrared cut precursor layer 24 may be, for example, an anthraquinone pigment, a cyanine pigment, a phthalocyanine pigment, a dithiol pigment, a diimonium pigment, a squarylium pigment, a chloronium pigment, and the like. The infrared absorbing pigment is preferably a cyanine pigment or a phthalocyanine pigment in these pigments.

The transparent resin for forming the infrared cut precursor layer 24 may be, for example, an acrylic resin, a polyamide resin, a polyimide resin, polyurethane resin, a polyester resin, a polyether resin, a polyolefin resin, a polycarbonate resin, a polystyrene resin, and a norbornene resin. The transparent resin is preferably an acrylic resin in these resins.

As illustrated in FIG. 5, a resist pattern RP that covers a portion positioned on the blue filter 12B in the infrared cut precursor layer 24 is formed. When the resist pattern RP is formed, first, a photoresist layer is formed on the color filters for respective colors. The photoresist layer may be formed using either a positive resist or a negative resist. Then, part of the photoresist layer is exposed using a photomask. In this event, in a case where the photoresist layer is formed using a positive resist, only a portion that covers the semiconductor substrate 21 in the photoresist layer is exposed. On the other hand, in a case where the photoresist layer is formed using a negative resist, only a portion that covers the cut filters for respective colors in the photoresist layer is exposed. Then, the photoresist layer is developed. By this means, the resist pattern RP that covers only a portion formed on the color filters in the infrared cut precursor layer 24 is formed.

Figure 6:
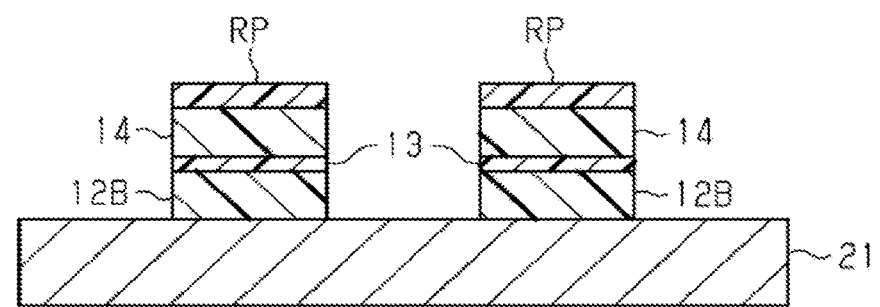
FIG. 6 explains the manufacturing method of the solid-state imaging element in the first embodiment.

As illustrated in FIG. 6, the infrared cut filter 14 is formed by dry etching the infrared cut precursor layer 24 using the resist pattern RP. Further, the patterned etching stopper layer 13 is formed. The dry etching may be, for example, plasma etching. In dry etching, a reactive gas and a noble gas, that is, a gas including a group 18 element can be used as an etching gas. The reactive gas may be, for example, oxygen gas, and the noble gas may be, for example, argon gas. In dry etching of the infrared cut precursor layer 24, a bias can be applied to an etching target including the infrared cut precursor layer 24. Application of the bias enables anisotropic etching using the resist pattern RP. By this means, a portion positioned on the surface of the semiconductor substrate 21 in the infrared cut precursor layer 24 and the etching stopper layer 23 is removed.

An etching rate of the etching stopper layer 23 is different from an etching rate of the infrared cut precursor layer 24. The etching rate is a thickness of each layer to be etched per unit time. The etching rate of the etching stopper layer 23 may be either lower or higher than the etching rate of the infrared cut precursor layer 24. The etching rate of the etching stopper layer 23 is preferably lower than the etching rate of the infrared cut precursor layer 24. This can make a period required for etching an unnecessary portion in the etching stopper layer 23 longer than in a case where the etching rate of the etching stopper layer 23 is higher than the etching rate of the infrared cut precursor layer 24. This makes it easy to adjust an etching period so that the etchant is less likely to reach the lower layer of the etching stopper layer 23.

In manufacturing of the filter for the solid-state imaging element, the infrared pass filter 12P is formed at a position at which the infrared cut precursor layer 24 is removed, and thus, it is desired to remove substantially all of an unnecessary portion of the infrared cut precursor layer 24 by over-etching in etching of the infrared cut precursor layer 24. Concerning this point, according to a configuration including the etching stopper layer 23, even if part of the infrared cut precursor layer 24 is removed by over-etching of the infrared cut precursor layer 24, the etching stopper layer 23 is positioned in the lower layer of the infrared cut precursor layer 24, so that the etchant is prevented from coming into contact with the semiconductor substrate 21. This leads to prevention of deterioration in functions of the solid-state imaging element 10 due to change of surface properties of the semiconductor substrate 21.

Note that to substantially completely remove a portion positioned on the surface of the semiconductor substrate 21 in the etching stopper layer 23, the etching rate of the etching stopper layer 23 and the etching rate of the lower layer of the etching stopper layer 23 are preferably different from each other. In the present embodiment, the etching rate of the etching stopper layer 23 and the etching rate of the semiconductor substrate 21 that is the lower layer of the etching stopper layer 23 are preferably different from each other.

Figure 7:
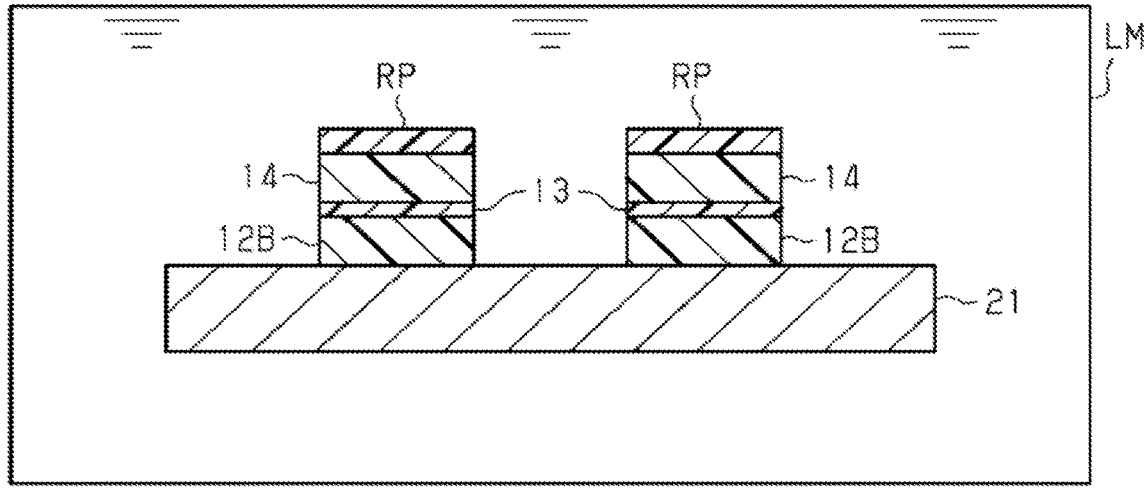
FIG. 7 explains the manufacturing method of the solid-state imaging element in the first embodiment.

As illustrated in FIG. 7, the resist pattern RP is peeled from the infrared cut filter 14 using a peeling liquid LM. A liquid in which a material forming the resist pattern RP is soluble can be used as the stripping liquid LM. For example, N-methylpyrrolidone or dimethylsulfoxide can be used as the stripping liquid LM. Note that while FIG. 7 illustrates a dip method as a method for bringing the resist pattern RP into contact with the stripping liquid LM, a spray method and a spin method can be used as the method for bringing the resist pattern RP into contact with the stripping liquid LM.

Figure 8:
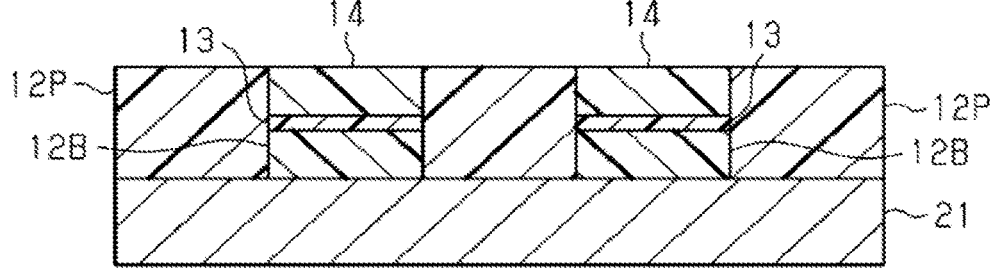
FIG. 8 explains the manufacturing method of the solid-state imaging element in the first embodiment.

As illustrated in FIG. 8, the infrared pass filter 12P is formed on a portion at which the photoelectric conversion element for infrared light is positioned in the semiconductor substrate 21. The infrared pass filter 12P is formed by forming a coating film containing a colored photosensitive resin and patterning the coating film through photolithography. The coating film containing the colored photosensitive resin is formed by, for example, applying an application liquid containing a photosensitive resin for infrared light and drying the coating film.

The photosensitive resin for infrared light contains a black pigment or a black dye and a photosensitive resin. The black pigment is a pigment having black color alone or a mixture having a black color produced by two or more types of pigments. The black dye may be, for example, an azo dye, an anthraquinone dye, an azine dye, a quinolone dye, a perinone dye, a perylene dye, a methane dye, and the like. The transparent resin may be, for example, an acrylic resin, a polyamide resin, a polyimide resin, a polyurethane resin, a polyester resin, a polyether resin, a polyolefin resin, a polycarbonate resin, a polystyrene resin, and a norbornene resin.

A material forming the infrared pass filter 12P can contain particles of an inorganic oxide for adjusting a refractive index. The inorganic oxide is, for example, aluminum oxide, silicon oxide, zirconium oxide, and a titanium oxide. The infrared pass filter 12P can contain additives for other functions such as a photostabilizer, an antioxidant, a thermostabilizer and an antistatic agent in addition to functions for preventing transmission of visible light as the infrared pass filter 12P.

The infrared pass filter 12P is formed through exposure and development of a region of the infrared pass filter 12P in the coating film containing a photosensitive resin for infrared light. The infrared pass filter 12P preferably has a thickness equal to a thickness of a laminate formed with the blue filter 12B, the etching stopper layer 13 and the infrared cut filter 14.

Figure 9:
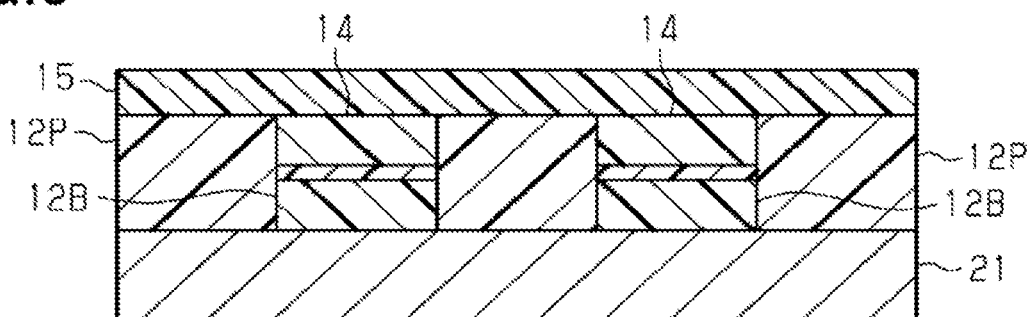
FIG. 9 explains the manufacturing method of the solid-state imaging element in the first embodiment.

As illustrated in FIG. 9, when viewed from a viewpoint facing a plane on which the semiconductor substrate 21 extends, the oxygen barrier layer 15 that covers a surface of the infrared cut filter 14 and a surface of the infrared pass filter 12P is formed. The oxygen barrier layer 15 is formed using a vapor phase film deposition method such as a sputtering method, a CVD method and an ion plating method or a liquid phase film deposition method such as a coating method. For example, an oxygen barrier layer 15 formed from silicon oxide may be formed through film formation using a sputtering method that uses a target including silicon oxide. For example, an oxygen barrier layer 15 formed from silicon oxide may be formed through film formation using a CVD method that uses silane and oxygen. For example, an oxygen barrier layer 15 including silicon oxide may be formed through application of a liquid containing polysilazane, reformulation, and drying of the coating film.

Figure 10:
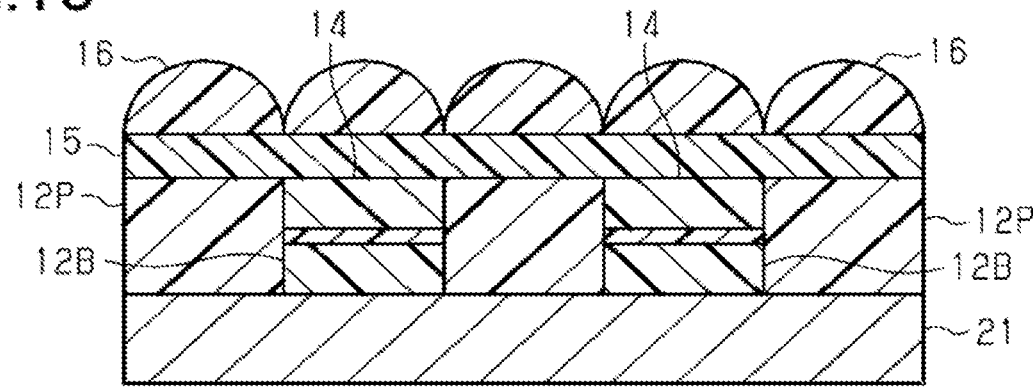
FIG. 10 explains the manufacturing method of the solid-state imaging element in the first embodiment.

As illustrated in FIG. 10, a plurality of microlenses 16 are formed on the oxygen barrier layer 15. As a result of this, the solid-state imaging element including the filter for the solid-state imaging element can be obtained. The plurality of microlenses 16 are formed at positions overlapping with the color filters and the infrared pass filter 12P when viewed from a viewpoint facing a plane on which the oxygen barrier layer 15 extends. Each microlens 16 is formed using, for example, an etch back method. In the etch back method, first, a transparent resin layer for forming the microlens 16 is formed. Then, a resist pattern having a shape in which a plurality of hemispheres are arranged is formed on the transparent resin layer. Then, a plurality of microlenses 16 are formed by transferring the shape of the resist pattern to the transparent resin layer through dry etching of the transparent resin layer using the resist pattern.

By this means, a plurality of solid-state imaging elements 10 described above with reference to FIG. 1 can be formed for one semiconductor substrate 21.

As described above, according to the manufacturing method of the filter for the solid-state imaging element and the manufacturing method of the solid-state imaging element of the first embodiment, the following effects can be obtained.

(1) Even if part of the infrared cut precursor layer 24 is removed through over-etching of the infrared cut precursor layer 24, the etching stopper layer 23 is positioned in the lower layer of the infrared cut precursor layer 24, so that the etchant can be prevented from reaching the lower layer of the etching stopper layer 23. This can prevent deterioration of functions of the solid-state imaging element 10 due to change of surface properties of the lower layer of the infrared cut precursor layer 24 that is the etching target.

(2) The oxygen barrier layer 15 prevents oxygen sources from reaching the infrared cut filter 14, so that the infrared pass filter 12P is less likely to be oxidized.

Modifications of First Embodiment

Note that the first embodiment described above can be implemented with the following modifications.

<Oxygen Barrier Layer>

The oxygen barrier layer 15 may be positioned on outer surfaces of the microlenses 16 as well as between the infrared cut filter 14 and the infrared pass filter 12P, and the respective microlenses 16.

Figure 11:
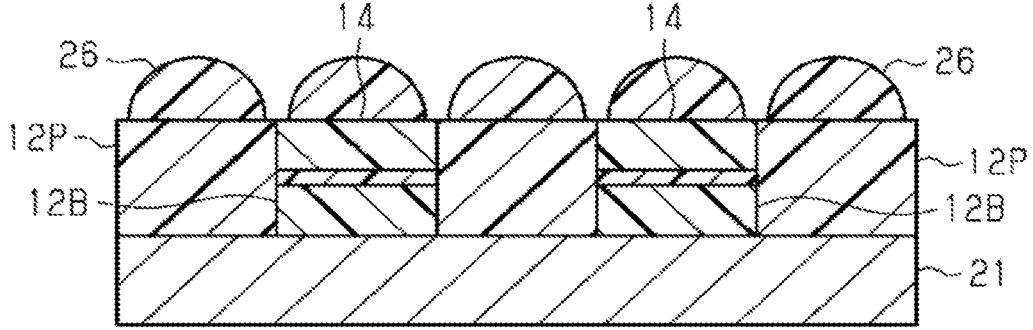
FIG. 11 explains a manufacturing method of a solid-state imaging element in a modification of the first embodiment.

In this case, as illustrated in FIG. 11, a plurality of microlenses 26 are formed on a surface including a surface of the infrared cut filter 14 and a surface of the infrared pass filter 12P. Each microlens 26 covers one of the color filters for respective colors and the infrared pass filter 12P.

Figure 12:
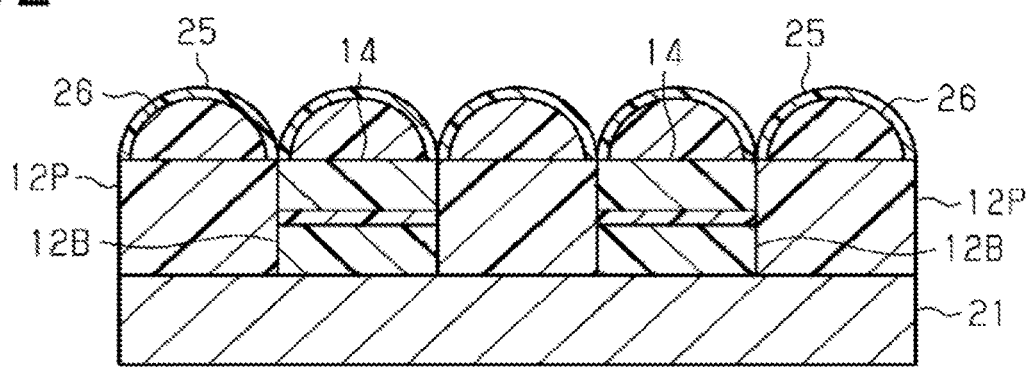
FIG. 12 explains the manufacturing method of the solid-state imaging element in the modification of the first embodiment.

As illustrated in FIG. 12, an oxygen barrier layer 25 that covers the surface of the plurality of microlenses 26 are formed. The oxygen barrier layer 25 may have a function as an antireflective layer.

The filter for the solid-state imaging element 10F does not have to include the oxygen barrier layer 15. Also in this case, effects equivalent to the above-described (1) can be obtained by forming the infrared cut precursor layer 24 on the etching stopper layer 23 that covers the surface of the semiconductor substrate 21.

A laminated structure of the oxygen barrier layer 25 may be a single-layer structure including a single compound, a laminated structure of layers including a single compound or a laminated structure of layers including compounds different from each other.

The surface of the infrared cut filter 14 and the surface of the infrared pass filter 12P may have a difference in level in a thickness direction of the semiconductor substrate 21. In this case, the oxygen barrier layer 15 may function as a flattening layer that fills the difference in level formed by the surface of the infrared cut filter 14 and the surface of the infrared pass filter 12P. Note that the oxygen barrier layer 15 can function as the flattening layer by having a thickness that can fill the difference in level between the surface of the infrared cut filter 14 and the surface of the infrared pass filter 12P.

<Infrared Pass Filter>

A thickness of the infrared pass filter 12P may be equal to thicknesses of the filters for respective colors. In this case, in the solid-state imaging element, the oxygen barrier layer 15 may fill the difference in level between the surface of the infrared pass filter 12P and the surface of the infrared cut filter 14. Alternatively, the solid-state imaging element may include a flattening layer that fills the difference in level between the surface of the infrared pass filter 12P and the surface of the infrared cut filter 14, separately from the oxygen barrier layer 15.

<Etching Stopper Layer>

A portion formed on the surface of the semiconductor substrate 21 in the etching stopper layer 23 does not have to be completely removed. Also in this case, as a result of the etching stopper layer 23 being formed of the transparent resin, light incident on the solid-state imaging element can be incident on the photoelectric conversion element via the etching stopper layer 23.

Second Embodiment

A second embodiment of the manufacturing method of the filter for the solid-state imaging element and the manufacturing method of the solid-state imaging element will be described with reference to FIG. 13 to FIG. 17. The second embodiment is different from the first embodiment in that the infrared pass filter is formed in a portion in which the color filters are not positioned in the semiconductor substrate before the etching stopper layer is formed. Thus, in the following description, the difference will be described in detail, and detailed description of processes common to those in the first embodiment will be omitted in the second embodiment. Note that in the second embodiment, the same reference numerals as in the first embodiment will be assigned to components common to those in the first embodiment.

Figure 13:
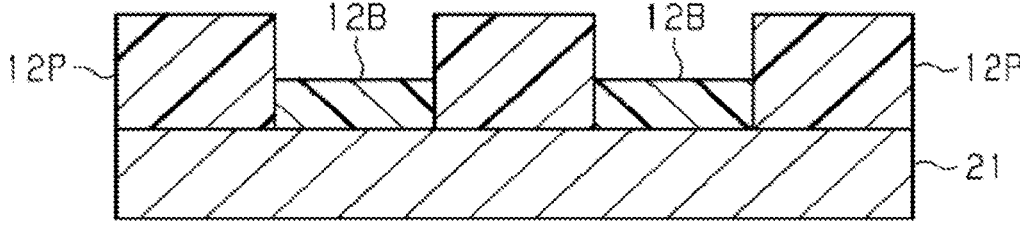
FIG. 13 explains a manufacturing method of a solid-state imaging element in a second embodiment.

As illustrated in FIG. 13, the blue filter 12B is formed at a position corresponding to the blue photoelectric conversion element provided at the semiconductor substrate 21, and the infrared pass filter 12P is formed at a position corresponding to the photoelectric conversion element for infrared light in the semiconductor substrate 21. In this event, the respective filters are formed so that the infrared pass filter 12P becomes thicker than the blue filter 12B.

Note that the color filters for respective colors including the blue filter 12B may be formed prior to the infrared pass filter 12P, or the infrared pass filter 12P may be formed prior to the color filters for respective colors. Further, each of the color filters for respective colors and the infrared pass filter 12P is formed using a method similar to the method for the color filters for respective colors and the infrared pass filter 12P in the first embodiment described above.

Figure 14:
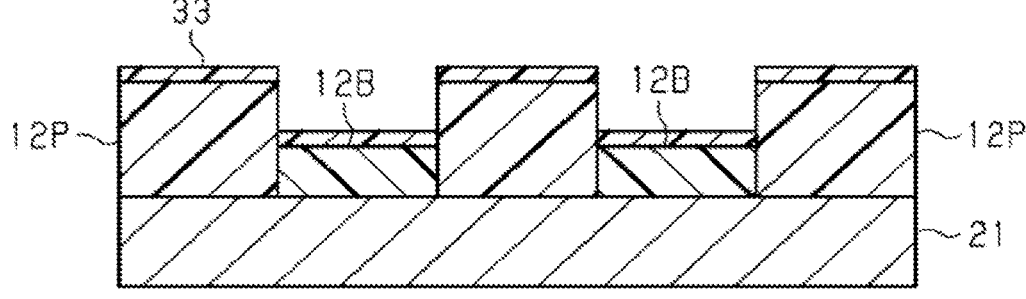
FIG. 14 explains the manufacturing method of the solid-state imaging element in the second embodiment.

As illustrated in FIG. 14, an etching stopper layer 33 is formed on the semiconductor substrate 21 including the blue filter 12B and the infrared pass filter 12P. As a result of this, the etching stopper layer 33 is formed on the color filters for respective colors and the infrared pass filter 12P. The etching stopper layer 33 is formed using a method similar to the method for the etching stopper layer 23 in the first embodiment described above.

Figure 15:
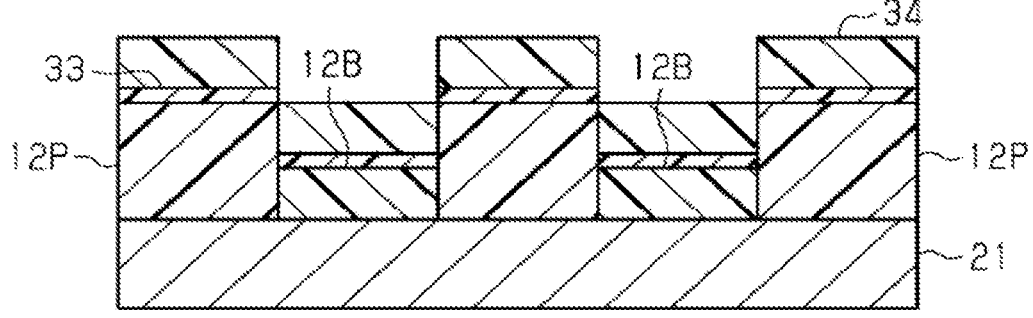
FIG. 15 explains the manufacturing method of the solid-state imaging element in the second embodiment.

As illustrated in FIG. 15, an infrared cut precursor layer 34 is formed on the etching stopper layer 33. As a result of this, the infrared cut precursor layer 34 is formed in portions positioned on both the blue filter 12B and the infrared pass filter 12P in the etching stopper layer 33. The infrared cut precursor layer 34 is formed using a method similar to the method for the infrared cut precursor layer 24 in the first embodiment described above.

Figure 16:
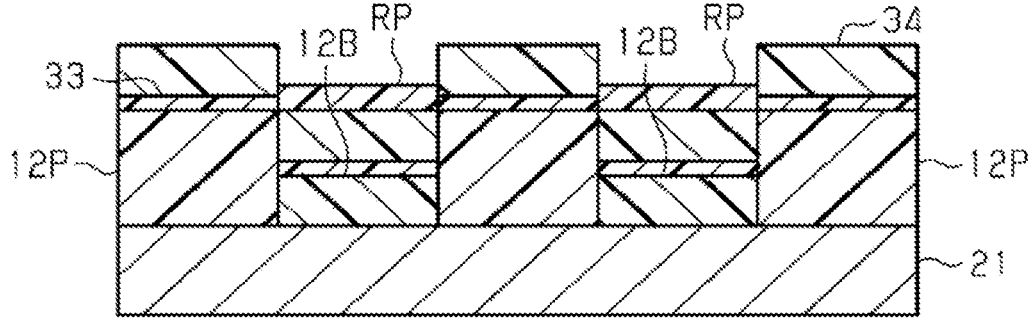
FIG. 16 explains the manufacturing method of the solid-state imaging element in the second embodiment.

As illustrated in FIG. 16, the resist pattern RP that covers portions positioned on the color filters for respective colors in the infrared cut precursor layer 34 is formed. When the resist pattern RP is formed, first, a photoresist layer is formed on the infrared cut precursor layer 34. The photoresist layer may be formed using either a positive resist or a negative resist in a similar manner to the first embodiment. Then, part of the photoresist layer is exposed using a photomask. In this event, in a case where the photoresist layer is formed using the positive resist, only a portion that covers the infrared pass filter 12P in the infrared cut precursor layer 34 is exposed. On the other hand, in a case where the photoresist layer is formed using the negative resist, only a portion that covers the color filters for respective colors in the photoresist layer is exposed. Then, the photoresist layer is developed. As a result of this, the resist pattern RP that covers only portions formed on the color filters for respective colors in the infrared cut precursor layer 34 is formed.

Figure 17:
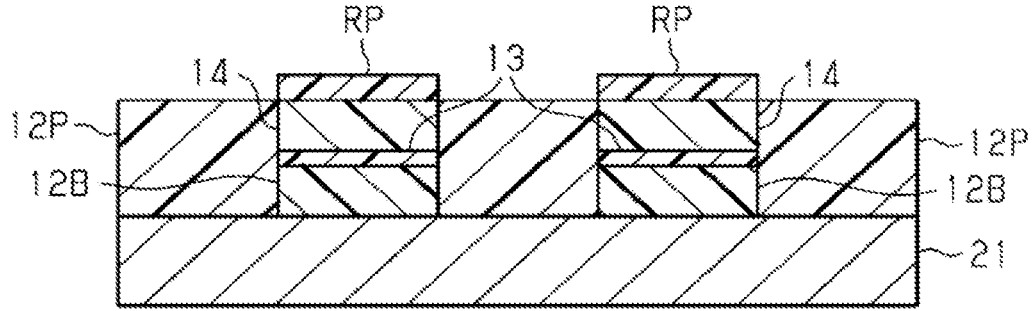
FIG. 17 explains the manufacturing method of the solid-state imaging element in the second embodiment.

As illustrated in FIG. 17, the infrared cut filter 14 is formed by dry etching the infrared cut precursor layer 34 using the resist pattern RP. Further, the patterned etching stopper layer 13 is formed. Portions positioned on the infrared pass filter 12P in the infrared cut precursor layer 34 and the etching stopper layer 33 are removed from the respective layers by etching using the resist pattern RP as an etching mask.

In the present embodiment, part of the infrared cut precursor layer 34 is positioned on the infrared pass filter 12P, and thus, it is necessary to substantially completely remove part of the infrared cut precursor layer 34 positioned on the infrared pass filter 12P in order to cause the infrared pass filter 12P to sufficiently exhibit its functions. To achieve this, the etching stopper layer 33 is positioned between the infrared pass filter 12P and the infrared cut precursor layer 34. This makes it possible for the etching stopper layer 33 to prevent change of surface properties of the infrared pass filter 12P even if the infrared cut precursor layer 34 is over etched to remove the infrared cut precursor layer 34, which results in preventing deterioration of functions of the solid-state imaging element due to change of the surface properties of the infrared pass filter 12P.

Note that to substantially completely remove a portion positioned on the infrared pass filter 12P in the etching stopper layer 33, an etching rate of the etching stopper layer 33 and an etching rate of the infrared pass filter 12P are preferably different from each other.

After the infrared cut filter 14 is formed, the solid-state imaging element is manufactured through processes similar to the processes described with reference to FIG. 7 to FIG. 10 in the first embodiment described above.

As described above, according to the manufacturing method of the filter for the solid-state imaging element and the manufacturing method of the solid-state imaging element in the second embodiment, effects equivalent to the above-described (1) and (2) can be obtained.

Modifications of Second Embodiment

Note that the above-described second embodiment can be implemented with the following modifications.
  The configuration disclosed in the second embodiment can be implemented in combination with the modifications of the oxygen barrier layer and the modifications of the etching stopper layer in the first embodiment.

Third Embodiment

A third embodiment of the manufacturing method of the filter for the solid-state imaging element and the manufacturing method of the solid-state imaging element will be described with reference to FIG. 18 and FIG. 19. The third embodiment is different from the first embodiment in that a partition wall that covers the color filters and the infrared cut filter is formed. Thus, differences will be described in detail below, and detailed description of processes common to those in the first embodiment will be omitted in the third embodiment. Note that in the third embodiment, the same reference numerals as in the first embodiment will be assigned to components common to those in the first embodiment.

In the manufacturing method of the solid-state imaging element of the present embodiment, first, the blue filter 12B, the etching stopper layer 23, the infrared cut precursor layer 24 and the resist pattern RP are formed on the semiconductor substrate 21 through the processes described with reference to FIG. 2 to FIG. 5 in the first embodiment described above.

Figure 18:
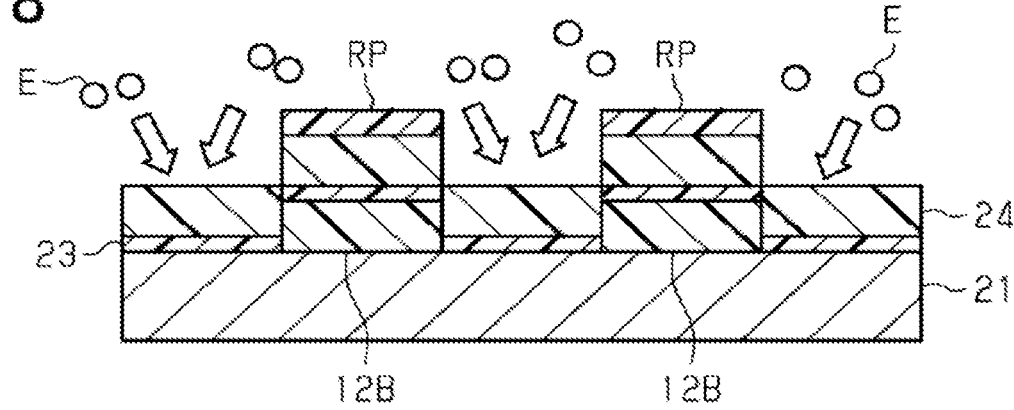
FIG. 18 explains a manufacturing method of a solid-state imaging element in a third embodiment.

Then, as illustrated in FIG. 18, the etching stopper layer 23 and the infrared cut precursor layer 24 formed on portions in which the blue filter 12B is not positioned in the surface of the semiconductor substrate 21 are removed through dry etching. In a similar manner to the first embodiment, in dry etching of the infrared cut precursor layer 24, plasma is generated from an etching gas. As a result of this, an etchant E in the plasma first comes into contact with the infrared cut precursor layer 24 and then, comes into contact with the etching stopper layer 23 that is the lower layer of the infrared cut precursor layer 24. As a result of this, at least the etching stopper layer 23 is sputtered by the etchant E, and particles are ejected from the etching stopper layer 23. At least part of the particles emitted from the etching stopper layer 23 adheres to a side surface of the blue filter 12B, a side surface of the etching stopper layer 23 positioned on the blue filter 12B and a side surface of a portion positioned on the blue filter 12B in the infrared cut precursor layer 24.

Figure 19:
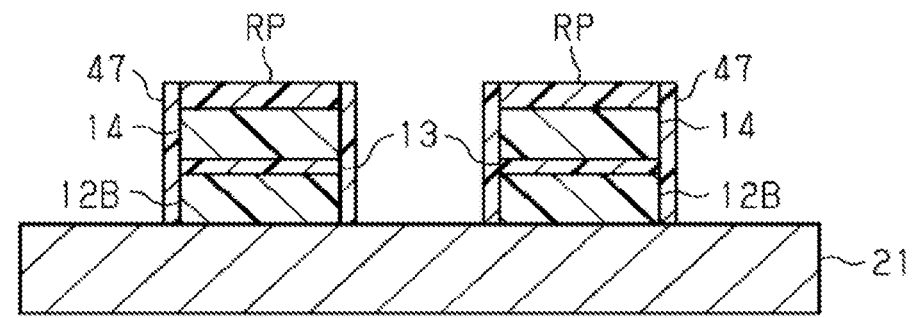
FIG. 19 explains the manufacturing method of the solid-state imaging element in the third embodiment.

By this means, as illustrated in FIG. 19, a partition wall 47 that covers the side surface of the blue filter 12B, the side surface of the etching stopper layer 13 and the side surface of the infrared cut filter 14 is formed. The partition wall 47 reflects incident light on an interface with layers adjacent to the partition wall 47. In other words, the partition wall 47 reflects light incident on the partition wall 47 due to a difference in the refractive index on the interface between the side surface of the blue filter 12B and part of the partition wall 47. Further, the partition wall 47 reflects light incident on the partition wall 47 due to a difference in the refractive index on the interface between the side surface of the etching stopper layer 13 and part of the partition wall 47. Still further, the partition wall 47 reflects light incident on the partition wall 47 due to a difference in the refractive index on the interface between the side surface of the infrared cut filter 14 and part of the partition wall 47.

By this means, light incident on the infrared cut filter 14 from obliquely upward is prevented from transmitting to outside of the infrared cut filter 14 by the partition wall 47. It is therefore possible to prevent decrease in an amount of light incident on the blue photoelectric conversion element positioned in the lower layer of the infrared cut filter 14. Further, light incident on the blue filter 12B from obliquely upward is prevented from being transmitted outside of the blue filter 12B by the partition wall 47. It is therefore possible to prevent decrease in an amount of light incident on the blue photoelectric conversion element positioned in the lower layer of the blue filter 12B. Still further, light incident on the blue filter 12B is prevented from being received by the photoelectric conversion elements corresponding to other filters.

The partition wall 47 can include at least a material forming the infrared cut precursor layer 24, a material forming the etching stopper layer 23, a reaction product of the material forming the infrared cut precursor layer 24 and the etchant E, or a reaction product of the material forming the etching stopper layer 23 and the etchant E.

In the manufacturing method of the solid-state imaging element of the present embodiment, the solid-state imaging element is manufactured by performing the processes described above with reference to FIG. 7 to FIG. 10 in the first embodiment described above after the partition wall 47 is formed. Note that in the process described above with reference to FIG. 7, the infrared absorbing pigment contained in the infrared cut filter 14 may be eluted to the peeling liquid LM by the peeling liquid LM being brought into contact with the infrared cut filter 14. Concerning this point, in the manufacturing method of the solid-state imaging element of the present embodiment, the side wall of the infrared cut filter 14 is covered with part of the partition wall 47 when the resist pattern RP is peeled using the peeling liquid LM, so that it is possible to make an area in contact with the peeling liquid LM in the infrared cut filter 14 smaller. This can prevent the infrared absorbing pigment contained in the infrared cut filter 14 from being eluted to the peeling liquid LM.

Note that in a case where the etching stopper layer 23 is formed with polysiloxane, the infrared absorbing pigment can be made less likely to be eluted by the partition wall 47 containing at least one of polysiloxane or a reaction product of polysiloxane and the etchant E.

A thickness of the partition wall 47 can be changed by adjusting various conditions in etching of the infrared cut precursor layer 24 and the etching stopper layer 23. The thickness of the partition wall 47 can be adjusted by, for example, a magnitude of a bias to be applied to the etching target including the infrared cut precursor layer 24 and the etching stopper layer 23. As the bias to be applied to the etching target is greater, the thickness of the partition wall 47 tends to be thicker. As the bias to be applied to the etching target is greater, energy of the etchant that comes into contact with the etching target is higher, and thus, particles for forming the partition wall 47 are more likely to be ejected from the infrared cut precursor layer 24 and the etching stopper layer 23.

Further, the thickness of the partition wall 47 can be adjusted, for example, in accordance with a level of a pressure of an atmosphere in which dry etching is performed. An amount of the etchant that can come into contact with the etching target changes in association with change of the level of the pressure. Further, a state where the particles emitted from the infrared cut precursor layer 24 and the etching stopper layer 23 come into contact with particles present in an atmosphere changes in association with change of the level of the pressure. The pressure of the atmosphere in which dry etching is performed may be, for example, equal to or greater than 0.1 Pa and equal to or less than 3.0 Pa. By this means, the partition wall 47 is easily formed on the side surface of the infrared cut filter 14 and the side surfaces of the color filters for respective colors.

Further, the thickness of the partition wall 47 can be adjusted in accordance with the thickness of the infrared cut precursor layer 24 and the thickness of the etching stopper layer 23. As each of the thickness of the infrared cut precursor layer 24 and the thickness of the etching stopper layer 23 becomes thicker, the thickness of the partition wall 47 tends to be thicker.

As described above, according to the manufacturing method of the filter for the solid-state imaging element and the manufacturing method of the solid-state imaging element of the third embodiment, effects listed below can be obtained in addition to the effects of (1) and (2) described above.

(3) Light incident on the color filters is prevented from being transmitted outside of the color filters from the side surfaces of the color filters by the partition wall 47. It is therefore possible to prevent decrease in an amount of light incident on the photoelectric conversion elements corresponding to the color filters.

(4) Light incident on the infrared cut filter 14 is also prevented from being transmitted outside of the infrared cut filter 14 from the side surface of the infrared cut filter 14 by the partition wall 47. It is therefore possible to further prevent decrease in an amount of light incident on the photoelectric conversion element via the color filters that are the lower layers of the infrared cut filter 14.

(5) The partition wall 47 containing at least one of polysiloxane or a reaction product of polysiloxane and the etchant prevents the peeling liquid from being brought into contact with the infrared cut filter 14. Thus, the infrared absorbing pigment contained in the infrared cut filter 14 is prevented from being eluted to the peeling liquid by the partition wall 47.

Modifications of Third Embodiment

Note that the above-described third embodiment can be implemented with the following modifications.
<Partition Wall>
While the partition wall 47 covers the side surfaces of the color filters, the partition wall 47 does not have to cover the side surface of the infrared cut filter 14. Also in this case, effects equivalent to the above-described (3) can be obtained.

Other Modifications

The configuration disclosed in the third embodiment can be implemented in combination with the configurations disclosed in the modifications of the oxygen barrier layer and the modification of the etching stopper layer in the first embodiment.

Fourth Embodiment

A fourth embodiment of the manufacturing method of the filter for the solid-state imaging element and the manufacturing method of the solid-state imaging element will be described with reference to FIG. 20 to FIG. 26. The fourth embodiment is different from the first embodiment in that before the etching stopper layer is formed, the infrared pass filter is formed in a portion in which the color filters are not positioned in the semiconductor substrate, and the partition wall that covers the side surface of the infrared cut filter is formed. Thus, differences will be described in detail below, and detailed description of processes common to those in the first embodiment will be omitted in the fourth embodiment. Note that in the fourth embodiment, the same reference numerals as in the first embodiment will be assigned to components common to those in the first embodiment.

Figure 20:
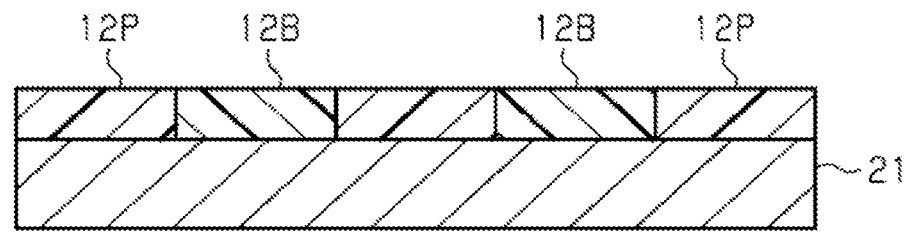
FIG. 20 explains a manufacturing method of a solid-state imaging element in a fourth embodiment.

As illustrated in FIG. 20, the blue filter 12B is formed in a portion in which the blue photoelectric conversion element is positioned in the semiconductor substrate 21. Further, the infrared pass filter 12P is formed in a portion in which the photoelectric conversion element for infrared light is positioned in the semiconductor substrate 21. In this event, in the present embodiment, the infrared pass filter 12P and the blue filter 12B are formed so that the thickness of the infrared pass filter 12P becomes equal to the thickness of the blue filter 12B. The blue filter 12B and the infrared pass filter 12P are formed using a method similar to the method for the blue filter 12B and the infrared pass filter 12P in the first embodiment described above.

Figure 21:
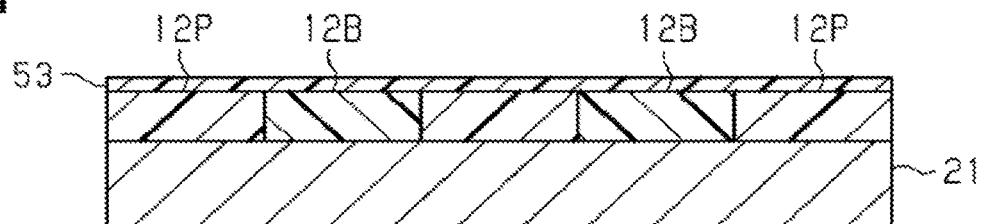
FIG. 21 explains the manufacturing method of the solid-state imaging element in the fourth embodiment.

As illustrated in FIG. 21, the etching stopper layer 53 is formed on the semiconductor substrate 21 including the blue filter 12B and the infrared pass filter 12P. As a result of this, the etching stopper layer 53 is formed on the blue filter 12B and the infrared pass filter 12P. The etching stopper layer 53 is formed using a method similar to the method for the etching stopper layer 23 in the first embodiment described above.

Figure 22:
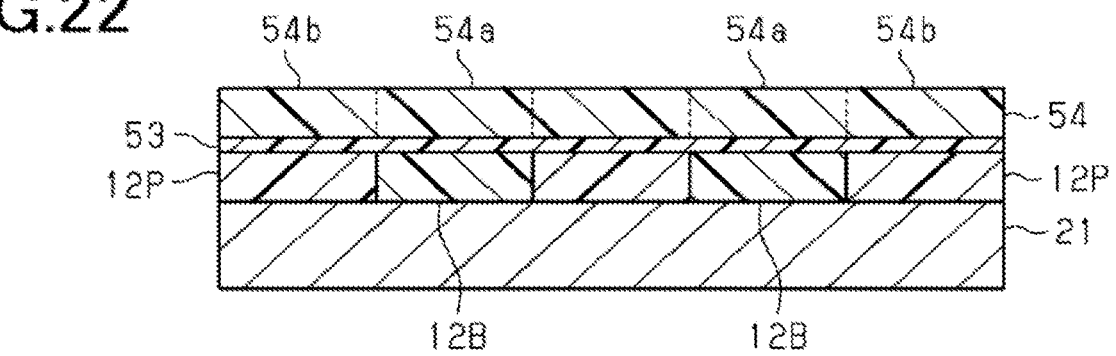
FIG. 22 explains the manufacturing method of the solid-state imaging element in the fourth embodiment.

As illustrated in FIG. 22, the infrared cut precursor layer 54 is formed on the etching stopper layer 53. In the infrared cut precursor layer 54, a portion positioned on the blue filter 12B is a first portion 54a, and a portion positioned on the infrared pass filter 12P is a second portion 54b. In the present embodiment, the thickness of the infrared pass filter 12P is equal to the thickness of the blue filter 12B, and thus, the infrared cut precursor layer 54 is formed so that a surface of the first portion 54a is positioned at a height equal to a surface of the second portion 54b in a thickness direction of the infrared cut precursor layer 54. The infrared cut precursor layer 54 is formed using a method similar to the method for the infrared cut precursor layer 24 in the first embodiment.

Figure 23:
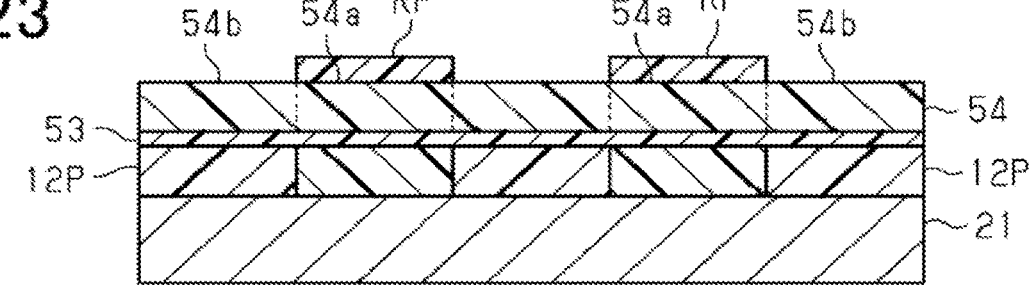
FIG. 23 explains the manufacturing method of the solid-state imaging element in the fourth embodiment.

As illustrated in FIG. 23, a resist pattern that covers only the first portion 54a in the infrared cut precursor layer 54 is formed. When the resist pattern RP is formed, first, a photoresist layer is formed on the infrared cut precursor layer 54. The photoresist layer may be formed using either a positive resist or a negative resist. Then, part of the photoresist layer is exposed using a photomask. In this event, in a case where the photoresist layer is formed using a positive resist, only a portion positioned on the second portion 54b in the photoresist layer is exposed. On the other hand, in a case where the photoresist layer is formed using a negative resist, only a portion positioned on the first portion 54a in the photoresist layer is exposed. Then, the photoresist layer is developed. By this means, the resist pattern RP that covers only the first portion 54a is formed.

As illustrated in FIG. 24, the infrared cut filter 14 is formed by dry etching the infrared cut precursor layer 54 using the resist pattern RP. The second portion 54b of the infrared cut precursor layer 54 and a portion covered by the second portion 54b in the etching stopper layer 53 are removed from the infrared pass filter 12P by dry etching of the resist pattern RP. In a similar manner to the third embodiment described above, in dry etching, the etchant E contained in the plasma comes into contact with the etching stopper layer 53 and the infrared cut precursor layer 54. As a result of this, the second portion 54b and the portion covered by the second portion 54b in the etching stopper layer 53 are removed.

In this event, in a similar manner to the third embodiment, at least the etching stopper layer 53 is sputtered by the etchant E, and particles are ejected from the etching stopper layer 53. At least some of the particles emitted from the etching stopper layer 53 adhere to the side surface in the first portion 54a of the infrared cut precursor layer 54.

As a result of this, as illustrated in FIG. 25, the partition wall 57 that covers the side surface of the infrared cut filter

14 is formed. The partition wall 57 reflects incident light on an interface with layers adjacent to the partition wall 57. In other words, the partition wall 57 reflects light incident on the partition wall 57 due to a difference in the refractive index at the interface between the side surface of the infrared cut filter 14 and part of the partition wall 57. By this means, light incident on the infrared cut filter 14 from obliquely upward is prevented from being transmitted to outside of the infrared cut filter 14 by the partition wall 57. It is therefore possible to prevent decrease in an amount of light incident on the blue photoelectric conversion element positioned in the lower layer of the infrared cut filter 14.

The partition wall 57 can include at least one of a material forming the infrared cut precursor layer 54, a material forming the etching stopper layer 53, a reaction product of the material forming the infrared cut precursor layer 54 and the etchant E, or a reaction product of the material forming the etching stopper layer 53 and the etchant E in a similar manner to the third embodiment. The infrared absorbing pigment contained in the infrared cut filter 14 is prevented from being eluted to the peeling liquid LM also by the partition wall 57 of the present embodiment in a similar manner to the partition wall 47 in the third embodiment.

As illustrated in FIG. 26, after the resist pattern RP is peeled from the infrared cut filter 14, a flattening layer 58 is formed that covers the surface of the infrared pass filter 12P, the surface of the infrared cut filter 14 and the partition wall 57 when viewed from a viewpoint facing a plane on which the semiconductor substrate 21 extends. The flattening layer 58 has a thickness that can fill a difference in level between the surface of the infrared pass filter 12P and the surface of the infrared cut filter 14. The flattening layer 58 may be formed through, for example, formation of a coating film containing a transparent resin and reflow of the coating film through heat treatment.

Then, the solid-state imaging element can be obtained through the processes described above with reference to FIG. 9 and FIG. 10 in the first embodiment.

As described above, according to the manufacturing method of the filter for the solid-state imaging element and the manufacturing method of the solid-state imaging element in the fourth embodiment, the following effects can be obtained in addition to the above-described (1), (2), (4) and (5).

(6) The surface of the first portion 54a is positioned at a height equal to the surface of the second portion 54b in the thickness direction of the infrared cut precursor layer 54, so that the partition wall 57 is easily formed on the entire side surface of the infrared cut filter 14. This increases certainty of the partition wall 57 preventing light incident on the infrared cut filter 14 from passing through the infrared cut filter 14 and being incident on the infrared pass filter 12P.

(7) By forming the infrared pass filter 12P having a thickness equal to or less than the thickness of the color filter, it is possible to form the partition wall 57 on the entire side surface of the infrared cut filter 14.

Modifications of Fourth Embodiment

Note that the above-described fourth embodiment can be implemented with the following modifications.
<Infrared Pass Filter>
The infrared pass filter 12P may be thinner than the color filters for respective colors. This makes the surface of the first portion 54a higher than the surface of the second portion 54b in the infrared cut precursor layer 54. This results in increasing reliability of forming the partition wall 57 on the whole side surface of the infrared cut filter 14.

The infrared pass filter 12P may be thicker than the color filters for respective colors. Also in this case, a total thickness of the thicknesses of the color filters for respective colors, the thickness of the etching stopper layer 53 and the thickness of the infrared cut precursor layer 54 is only required to be thicker than the infrared pass filter 12P. This can make it possible to form the partition wall 57 in a portion projecting from the infrared pass filter 12P in the side surface of the infrared cut filter 14.

Other Modifications

The configuration disclosed in the fourth embodiment can be implemented in combination with the configurations disclosed in the modifications of the oxygen barrier layer and the modification of the etching stopper layer in the first embodiment.

Example

A manufacturing example of the solid-state imaging element corresponding to the fourth embodiment will be described below. Note that in the manufacturing example described below, a manufacturing example of the solid-state imaging element in a case where the infrared pass filter is thicker than the color filters of respective colors will be described.

A resist layer for green color obtained by spin coating a resist for green color containing a green pigment, a photosensitive curable resin and a thermosetting resin at rotation speed of 1000 rpm was formed on a semiconductor substrate on which a plurality of photoelectric conversion elements were arranged in two dimensions. For the green pigment, color [index] C.I. PG58 was used. In the resist for green color, the concentration of the green pigment was set at 70 percentage by mass. Then, after the green resist layer was selectively exposed using a green mask, a green filter pattern was formed by developing the green resist layer after the exposure. Then, the green filter pattern was cured by heating for six minutes at 230° C. using a hot plate. By this means, the green filter having a thickness of 600 nm was formed.

Then, a blue resist obtained by spin coating a blue resist containing a pigment, a photosensitive curable resin and a thermosetting resin at rotation speed of 1000 rpm was formed on the green filter and in a portion not covered by the green filter in the semiconductor substrate. Color indexes C.I.PB156 and C.I.PV23 were used as the pigments. In the blue resist, concentration of the pigment was set at 50 percentage by mass. Then, after the blue resist layer was selectively exposed through photolithography using a mask for the blue color, a blue filter pattern was formed by developing the resist layer for the blue color after the exposure. Then, the blue filter pattern was cured by heating for six minutes at 230° C. using a hot plate. By this means, the blue filter having a thickness of 600 nm was formed. In this event, the blue filter was formed at a position different from the position at which the green filter was formed in the surface of the semiconductor substrate.

Then, a red resist layer obtained by spin coating a red resist containing a pigment, a photosensitive curable resin and a thermosetting resin at rotation speed of 1000 rpm was formed on the green filter, on the blue filter and in a portion not covered by these filters in the semiconductor substrate.

Color indexes C.I.PR254 and C.I.PY139 were used as the pigment. In the red resist, concentration of the pigment was set at 60 percentage by mass. Then, after the red resist layer was selectively exposed using a red mask, a filter pattern for red color was formed by developing the resist layer for red color after the exposure. Then, the filter pattern for red color was cured by heating for six minutes at 230° C. using a hot plate. By this means, the red filter having a thickness of 600 nm was formed. In this event, the red filter was formed at a position different from the positions at which the blue filter and the green filter were formed in the surface of the semiconductor substrate.

Then, a photosensitive resist for passing infrared light containing a blue pigment, a purple pigment and a yellow pigment was applied to the color filters for respective colors and in a portion not covered by the color filters in the semiconductor substrate. By this means, a resist layer for passing infrared light was formed. C.I.PB15:6 in the color index was used as the blue pigment, C.I.PV23 in the color index was used as the purpler pigment, and C.I.PY139 in the color index was used as the yellow pigment. In the resist for passing infrared light, concentration of the pigment was set at 78 percentage by mass.

Then, after the resist layer for passing infrared light was exposed using a mask for passing infrared light, an infrared pass filter pattern was formed by developing the resist layer for passing infrared light after the exposure. Then, the infrared pass filter pattern was cured by heating for six minutes at 230° C. using a hot plate. By this means, an infrared pass filter having a thickness of 1500 nm was formed. In this event, the infrared pass filter was formed at a position different from the positions at which the above-described filters for respective colors were formed in the surface of the semiconductor substrate. Note that in the infrared pass filter, a maximum value of transmittance with respect to light having a wavelength equal to or greater than 400 nm and equal to or less than 650 nm was 4.8%, and a maximum value of transmittance with respect to light having a wavelength equal to or greater than 650 nm and equal to or less than 730 nm was 8.6%. Further, in the infrared pass filter, a minimum value of transmittance with respect to transmittance having a wavelength equal to or greater than 800 nm and equal to or less than 1000 nm was 92.1%.

A coating film was formed on the filters for respective colors and the infrared pass filter by spin coating a dispersion liquid containing siloxane at rotation speed of 2000 rpm. Then, the coating film was cured by heating for 20 minutes at 200° C. using a hot plate. By this means, an etching stopper layer having a thickness of 50 nm was formed on the filters for respective colors and the infrared pass filter. In the etching stopper layer, transmittance with respect to visible light was 91%, and the refractive index was 1.40.

Then, a coating film was formed on the etching stopper layer by spin coating a liquid containing an infrared absorbing pigment and a thermosetting resin at rotation speed of 1000 rpm. Then, the coating film was cured by heating for 20 minutes at 200° C. using a hot plate. By this means, the infrared cut precursor layer having a thickness of 1600 nm was formed on the etching stopper layer. In the infrared cut precursor layer, transmittance with respect to light having a wavelength around 940 nm was 8%.

A resist layer was formed by spin coating a liquid containing a positive resist (OFPR-800, manufactured by Tokyo Ohka Kogyo Co., Ltd.) on the infrared cut precursor layer at rotation speed of 1000 rpm using a spin coater. Then, the resist layer was pre-baked for one minute at 90° C. By this means, a resist layer having a thickness of 1.5 μm was formed. Then, the resist layer was selectively exposed using a photomask. The i line was used to expose the resist layer. Then, the resist layer after exposure was developed using tetramethylammonium hydroxide (TMAH) at 2.38 percent by mass. By this means, a resist pattern was formed having an opening that exposes a portion covering the infrared pass filter in the infrared cut precursor layer when viewed from a viewpoint facing a plane on which the infrared cut precursor layer spreads. In this event, an opening having a square shape was formed such that the opening has a vertical length of 1.1 μm and a horizontal length of 1.1 μm at an edge of the opening.

Then, the infrared cut precursor layer was dry etched using the resist pattern. In this event, an ICP type dry etching device was used as a dry etching device. Argon gas and a mixture gas containing oxygen gas were used as an etching gas, and anisotropic etching was performed on the infrared cut precursor layer by applying a bias to the etching target. By this means, an infrared cut filter was formed. Further, a partition wall containing at least one of a material forming the infrared cut precursor layer, a material forming the etching stopper layer, a reaction product of the material forming the infrared cut precursor layer and the etchant or a reaction product of the material forming the etching stopper layer and the etchant was formed. Note that a thickness of the partition wall was 25 nm, and the partition wall was formed in a portion projecting from the infrared pass filter in the side surface of the infrared cut filter.

Then, the positive resist used as the etching mask was removed. The positive resist was removed by a spray cleaning device using a stripping liquid (104, manufactured by Tokyo Ohka Kogyo Co., Ltd.).

Then, a plurality of microlenses having a height of 500 nm were formed on the infrared cut filter and the infrared pass filter using an etch back method. Then, an oxygen barrier layer which was formed from $SiO_2$ using a plasma CVD method and which had a thickness of 100 nm was formed on surfaces of the microlenses. By this means, a solid-state imaging element was obtained.

The present application addresses the following. In the way, in manufacturing of a solid-state imaging element having fine pixels, a dry etching method has been proposed as a processing method of respective layers that form the solid-state imaging element. In the dry etching method, part of an etching target is removed by an etchant in plasma coming into contact with the etching target. In the dry etching method, normally, dry etching processing is continuously applied to the etching target over a certain period after a lower layer of the etching target has been exposed, for the purpose of improving accuracy of processing by dry etching. In this case, properties on a surface of the lower layer change as a result of the etchant of the etching target also coming into contact with the lower layer of the etching target. This may cause deterioration of functions of the solid-state imaging element.

The present invention is directed to providing a manufacturing method of a filter for a solid-state imaging element that can prevent functional deterioration due to change of surface properties in the lower layer of the etching target, and a manufacturing method of the solid-state imaging element.

A manufacturing method of a filter for a solid-state imaging element includes forming a color filter on a semiconductor substrate, forming an etching stopper layer on the semiconductor substrate and the color filter, forming an infrared cut precursor layer on the etching stopper layer, forming a resist pattern that covers a portion positioned on the color filter in the infrared cut precursor layer, and forming an infrared cut filter by dry etching the infrared cut precursor layer using the resist pattern, and an etching rate of the infrared cut precursor layer in the dry etching is different from an etching rate of the etching stopper layer.

A manufacturing method of a solid-state imaging element for solving the above-described problem includes preparing a semiconductor substrate, and manufacturing a filter for a solid-state imaging element using the above-described manufacturing method of the filter for the solid-state imaging element.

According to the above-described manufacturing method of the filter for the solid-state imaging element and manufacturing method of the solid-state imaging element, even if part of the infrared cut precursor layer is removed by over etching of the infrared cut precursor layer, the etching stopper layer is positioned in a lower layer of the infrared cut precursor layer, so that it is possible to prevent the etchant from reaching a lower layer of the etching stopper layer. This can prevent functional deterioration of the solid-state imaging element due to change of surface properties of the lower layer of the infrared cut precursor layer that is an etching target.

REFERENCE SIGNS LIST

10 . . . Solid-state imaging element
10F . . . Filter for solid-state imaging element filter
11 . . . Photoelectric conversion element
12B . . . Blue filter
12G . . . Green filter
12P . . . Infrared pass filter
12R . . . Red filter
13, 23, 33, 53 . . . Etching stopper layer
14 . . . Infrared cut filter
15, 25 . . . Oxygen barrier layer
16, 26 . . . Microlens
21 . . . Semiconductor substrate
24, 34, 54 . . . Infrared cut precursor layer
47, 57 . . . Partition wall
54a . . . First portion
54b . . . Second portion
58 . . . Flattening layer
RP . . . Resist pattern Obviously, numerous modifications and variations of the present invention are possible in light of the above teachings. It is therefore to be understood that within the scope of the appended claims, the invention may be practiced otherwise than as specifically described herein.

What is claimed is:

1. A method of manufacturing a filter for a solid-state imaging element, comprising:
    forming a color filter on a semiconductor substrate;
    forming an etching stopper layer on the semiconductor substrate and the color filter;
    forming an infrared cut precursor layer on the etching stopper layer;
    forming a resist pattern that covers a portion on the color filter in the infrared cut precursor layer; and
    forming an infrared cut filter by dry etching the infrared cut precursor layer using the resist pattern, wherein
    the dry etching of the infrared cut precursor layer is conducted at an etching rate different from an etching rate of the etching stopper layer, the forming of the infrared cut filter includes forming a partition wall by dry etching the infrared cut precursor layer and the etching stopper layer, and the partition wall covers a side surface of the color filter and reflects incident light.

2. The method according to claim 1, wherein the forming of the etching stopper layer includes forming the etching stopper layer on the color filter and in a portion where the color filter is not formed in the semiconductor substrate.

3. The method according to claim 1, wherein the forming of the infrared cut filter includes forming the partition wall that covers a side surface of the infrared cut filter by dry etching the infrared cut precursor layer and the etching stopper layer.

4. The method according to claim 3, wherein the forming of the etching stopper layer includes forming the etching stopper layer with polysiloxane, and the forming of the infrared cut filter includes stripping the resist pattern from the infrared cut filter using a stripping liquid after the dry etching.

5. The method according to claim 1, further comprising:

forming an infrared pass filter in a portion where the color filter is not positioned in the semiconductor substrate before the forming of the etching stopper layer, wherein the forming of the infrared cut precursor layer includes forming the infrared cut precursor layer in a first portion on the color filter and in a second portion on the infrared pass filter, and the first portion has a surface positioned at a height equal to or higher than a surface of the second portion in a thickness direction of the infrared cut precursor layer.

6. The method according to claim 5, wherein the forming of the infrared pass filter includes forming the infrared pass filter having a thickness equal to or less than a thickness of the color filter.

7. The method according to claim 5, wherein the forming of the etching stopper layer includes forming the etching stopper layer with polysiloxane, and the forming of the infrared cut filter includes stripping the resist pattern from the infrared cut filter using a stripping liquid after the dry etching.

8. The method according to claim 5, further comprising:

forming an oxygen insulation layer that covers a surface of the infrared cut filter and a surface of the infrared pass filter when viewed from a viewpoint facing a plane on which the semiconductor substrate extends; and forming a plurality of microlenses on the oxygen insulation layer.

9. The method according to claim 5, further comprising:

forming a plurality of microlenses on surfaces including a surface of the infrared cut filter and a surface of the infrared pass filter; and forming an oxygen insulation layer that covers surfaces of the microlenses.

10. A method of manufacturing a solid-state imaging element, comprising:

preparing a semiconductor substrate;

forming a color filter on the semiconductor substrate;

forming an etching stopper layer on the semiconductor substrate and the color filter;

forming an infrared cut precursor layer on the etching stopper layer;

forming a resist pattern that covers a portion on the color filter in the infrared cut precursor layer; and forming an infrared cut filter by dry etching the infrared cut precursor layer using the resist pattern, wherein the dry etching of the infrared cut precursor layer is conducted at an etching rate different from an etching rate of the etching stopper layer, the forming of the infrared cut filter includes forming a partition wall by dry etching the infrared cut precursor layer and the etching stopper layer, and the partition wall covers a side surface of the color filter and reflects incident light.

11. The method according to claim 10, wherein the forming of the etching stopper layer includes forming the etching stopper layer on the color filter and in a portion where the color filter is not formed in the semiconductor substrate.

12. The method according to claim 10, wherein the forming of the infrared cut filter includes forming the partition wall that covers a side surface of the infrared cut filter by dry etching the infrared cut precursor layer and the etching stopper layer.

13. The method according to claim 12, wherein the forming of the etching stopper layer includes forming the etching stopper layer with polysiloxane, and the forming of the infrared cut filter includes stripping the resist pattern from the infrared cut filter using a stripping liquid after the dry etching.

14. The method according to claim 10, further comprising:

forming an infrared pass filter in a portion where the color filter is not positioned in the semiconductor substrate before the forming of the etching stopper layer, wherein the forming of the infrared cut precursor layer includes forming the infrared cut precursor layer in a first portion on the color filter and in a second portion on the infrared pass filter, and the first portion has a surface positioned at a height equal to or higher than a surface of the second portion in a thickness direction of the infrared cut precursor layer.

15. The method according to claim 14, wherein the forming of the infrared pass filter includes forming the infrared pass filter having a thickness equal to or less than a thickness of the color filter.

16. The method according to claim 14, wherein the forming of the etching stopper layer includes forming the etching stopper layer with polysiloxane, and the forming of the infrared cut filter includes stripping the resist pattern from the infrared cut filter using a stripping liquid after the dry etching.

17. The method according to claim 14, further comprising:

forming an oxygen insulation layer that covers a surface of the infrared cut filter and a surface of the infrared pass filter when viewed from a viewpoint facing a plane on which the semiconductor substrate extends; and forming a plurality of microlenses on the oxygen insulation layer.

18. The method according to claim 14, further comprising:

forming a plurality of microlenses on surfaces including a surface of the infrared cut filter and a surface of the infrared pass filter; and forming an oxygen insulation layer that covers surfaces of the microlenses.

* * * * *